United States Patent
Rajwade et al.

(10) Patent No.: US 9,910,594 B2
(45) Date of Patent: Mar. 6, 2018

(54) APPARATUSES AND METHODS FOR CONCURRENTLY ACCESSING MULTIPLE MEMORY PLANES OF A MEMORY DURING A MEMORY ACCESS OPERATION

(71) Applicant: MICRON TECHNOLOGY, INC., Boise, ID (US)

(72) Inventors: Shantanu R. Rajwade, Santa Clara, CA (US); Pranav Kalavade, Santa Clara, CA (US); Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/933,874

(22) Filed: Nov. 5, 2015

(65) Prior Publication Data

US 2017/0131904 A1    May 11, 2017

(51) Int. Cl.
G06F 3/06    (2006.01)
G06F 13/16    (2006.01)
G06F 13/42    (2006.01)

(52) U.S. Cl.
CPC .......... *G06F 3/0604* (2013.01); *G06F 3/0629* (2013.01); *G06F 3/0673* (2013.01); *G06F 13/16* (2013.01); *G06F 13/42* (2013.01)

(58) Field of Classification Search
CPC ... G06F 3/0604; G06F 3/0629; G06F 12/0238

(Continued)

(56) References Cited

U.S. PATENT DOCUMENTS 6,038,187 A    3/2000  Hajji
6,735,116 B2    5/2004  Lee et al.
(Continued)

FOREIGN PATENT DOCUMENTS

EP    2750018 A2    7/2014
WO    2016025173 A1    2/2016

OTHER PUBLICATIONS

U.S. Appl. No. 15/614,072; entitled "Apparatuses and Methods for Concurrently Accessing Different Memory Planes of a Memory", filed Jun. 5, 2017.

(Continued)

*Primary Examiner* — Than Nguyen
(74) *Attorney, Agent, or Firm* — Dorsey & Whitney LLP

(57) ABSTRACT

Apparatuses and methods for performing concurrent memory access operations for multiple memory planes are disclosed herein. An example method may include receiving first and second command and address pairs associated with first and second plane, respectively, of a memory. The method may further include, responsive to receiving the first and second command and address pairs, providing a first and second read voltages based on first and second page type determined from the first and second command and address pair. The method may further include configuring a first GAL decoder circuit to provide one of the first read voltage or a pass voltage on each GAL of a first GAL bus. The method may further include configuring a second GAL decoder circuit to provide one of the second read level voltage signal or the pass voltage signal on each GAL of a second GAL bus coupled to the second memory plane.

34 Claims, 7 Drawing Sheets

(58) Field of Classification Search
USPC .................................................. 711/103, 154
See application file for complete search history.

(56) References Cited

U.S. PATENT DOCUMENTS

| | | | |
|---|---|---|---|
| 7,280,398 B1 | 10/2007 | Lee | |
| 8,117,436 B2 | 2/2012 | Zhang et al. | |
| 8,289,802 B2 | 10/2012 | Lee | |
| 8,379,450 B2 | 2/2013 | Kim | |
| 8,473,669 B2 | 6/2013 | Sinclair | |
| 8,533,405 B2 | 9/2013 | Kim et al. | |
| 8,619,493 B2 | 12/2013 | Kim | |
| 8,966,201 B2 | 2/2015 | Sela et al. | |
| 9,691,452 B2 | 6/2017 | Pekny et al. | |
| 2005/0268024 A1 | 12/2005 | Seo et al. | |
| 2011/0191651 A1 | 8/2011 | Chen et al. | |
| 2011/0208896 A1* | 8/2011 | Wakrat | G06F 12/0246 |
| | | | 711/103 |
| 2012/0014168 A1 | 1/2012 | Li et al. | |
| 2012/0113721 A1 | 5/2012 | Kim | |
| 2013/0279251 A1* | 10/2013 | Lee | G11C 16/26 |
| | | | 365/185.03 |
| 2014/0068159 A1 | 3/2014 | Yi et al. | |
| 2014/0173174 A1 | 6/2014 | Frickey et al. | |
| 2014/0281141 A1 | 9/2014 | Manohar | |
| 2015/0003156 A1 | 1/2015 | Berckmann et al. | |
| 2015/0063024 A1 | 3/2015 | Yip et al. | |
| 2016/0048343 A1* | 2/2016 | Pekny | G11C 7/22 |
| | | | 711/103 |

OTHER PUBLICATIONS

International Search Report and Written Opinion Received for PCT Appl. No. PCT/US2016/059484 dated Jan. 31, 2017.
First Office Action dated Jan. 2, 2018 for Taiwanese Application No. 105135912.

\* cited by examiner

APPARATUSES AND METHODS FOR CONCURRENTLY ACCESSING MULTIPLE MEMORY PLANES OF A MEMORY DURING A MEMORY ACCESS OPERATION

BACKGROUND

Memories may be provided in a variety of apparatuses, such as computers or other devices, including but not limited to portable memory devices, solid state drives, music players, cameras, phones, wireless devices, displays, chip sets, set top boxes, gaming systems, vehicles, and appliances. There are many different types of memory including volatile memory (e.g., dynamic random access memory (DRAM)) and non-volatile memory (e.g., flash memory). Flash memory architectures may include NAND or NOR architecture.

In non-volatile memories (e.g., NAND flash memories), memory arrays may be divided into planes. Dividing a memory into memory planes may break up rows or columns into smaller sections for accessing during memory access operations. Breaking the memory up into memory planes may also present an opportunity to access more than one portion of the memory array concurrently. Typically, concurrent access may require access of memory cells that are coupled through a single global access line (GAL) decoder circuit, which may limit an ability to concurrently access multiple pages on different columns (or wordlines) in different memory planes during random memory access requests.

DETAILED DESCRIPTION

Apparatuses and methods for concurrent access of multiple memory planes are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
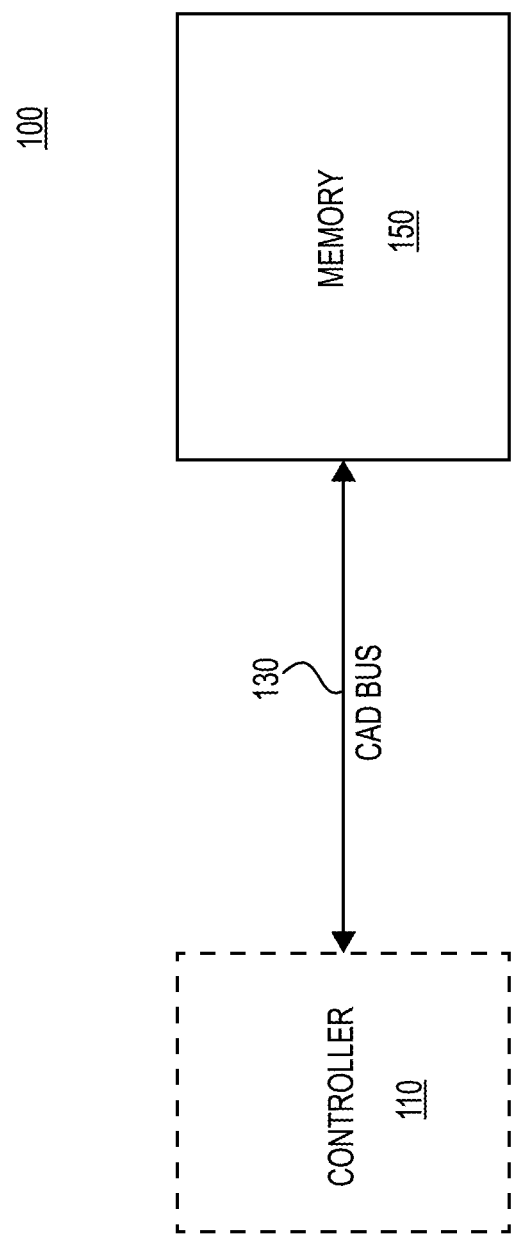
FIG. 1 is a block diagram of an apparatus including a memory configured to perform concurrent memory access of multiple memory planes according to an embodiment of the present disclosure.

FIG. 1 is a block diagram of an apparatus 100 (e.g., an integrated circuit, a memory device, a memory system, an electronic device or system, a smart phone, a tablet, a computer, a server, etc.) including a memory configured to perform concurrent memory access of multiple memory planes according to an embodiment of the present disclosure. The apparatus 100 may include a memory 150. In some embodiments, the memory 150 may be coupled to a controller 110 via a command, address, and data (CAD) bus 130. The memory 150 may be configured to receive commands and/or addresses from the controller 110 over the CAD bus 130, and the memory may be configured to receive data and/or provide data over the CAD bus 130.

In some examples, the memory 150 may be a non-volatile memory, such as NAND, NOR, or phase-change memory. The memory 150 may include an array of cells organized across multiple planes (e.g., partitions). The memory planes may be divided into blocks, with each block having multiple memory cell pages. Each page may include a row or column of memory cells that are coupled to a respective access line. The memory 150 may provide a read level voltage signal to an access line of a selected block of a plane during a memory access operation to erase, program, and/or read from a page of memory cells. The read level voltage profiles required to access data of a page of memory cells may depend on a page type. A page type may be based on a type of memory cell in the page (e.g., single level cell SLC, multi-level cell MLC, triple level cell TLC, etc.) and a level of the memory cells being accessed (e.g., upper page UP, lower page LP, middle page MP, for a SLC/MLC/TLC page). The memory 150 may include circuitry that performs concurrent memory page accesses of two or more memory planes. For example, the memory 150 may include a respective global access line (GAL) decoder circuit and a respective read level voltage regulator circuit associated with each memory plane of the memory 150 to facilitate concurrent access of pages of two or more memory planes, including different page types. Each of the GAL decoder circuits may be coupled to a respective one of the memory planes via a respective GAL bus. In some embodiments, the memory 150 may further include one or more pass voltage circuits configured to provide respective pass voltage signals to each of the GAL decoder circuits. In some embodiments, the memory page accesses are concurrent, for example, memory access operations for the respective memory pages at least partially temporally overlap. In some embodiments, memory access operations for the respective memory pages may occur simultaneously, however, embodiments of the invention are not limited to simultaneous memory access operations.

In some examples, the memory 150 may include an internal controller configured to control concurrent access of different pages of two or more memory planes. That is, the internal controller may provide a respective set of GAL control signals to each of the GAL decoder circuits associated with the two or more memory planes in order to control voltages provided on the respective GAL buses. The internal controller may further provide a respective read level voltage control signal to each of the read level voltage regulator circuits associated with the two or more memory planes to control the respective read level voltage profile provided on the respective read level voltage signals. The concurrent read accesses may be based on pairs of command and address data received from the controller 110 via the CAD bus 130. The internal controller may concurrently access the respective pages of each of the two or more memory planes during the concurrent memory access operations, for example, by controlling, retrieving data from, and/or providing data to page buffers associated with each of the two or more memory planes.

During operation, the memory 150 may receive a group of memory command and address pairs. The received group of memory command and address pairs may be provided by the controller 110 via the CAD bus. In some embodiments, the controller 110 may command concurrent read accesses by the memory 150. The memory 150 may be configured to perform concurrent memory operations (e.g., read operations or program operations) for two or more memory planes associated with the group of memory command and address pairs. For example, when the group of memory command and address pairs are read commands, the memory 150 may concurrently retrieve read data from two or more memory planes of the memory 150. The memory 150 may provide the read data to the controller 110 and receive the data from the controller 110 via the CAD bus 130. The memory 150 may provide additional information to the controller 110 over the CAD bus 130 in response to particular commands. The information may indicate, for instance, whether the memory 150 is available to perform a memory operation and/or an amount of time before the memory 150 may become available to perform a memory operation.

Typically, during a memory access operation, a procedure for accessing data of a page may be dependent on a page type. That is, to read data from an MLC or TLC page, read level voltage profiles may depend on which level (e.g., bit) of each memory cell of the page is being read. For example, if a bit in the LP of an MLC page is being read, a read level voltage signal having a first read level voltage profile may be provided to the associated GAL of the GAL bus and pass voltage signals having one or more pass voltage profiles may be provided to other GALs of the GAL bus during the read operation. That is, the pass voltage signals may all be common voltages and voltage profiles, or some may have different voltages or voltage profiles. For example, the pass voltage provided to GALs adjacent to the GAL receiving the first read voltage may be different than the pass voltage profiles provided to other remaining GALs. If a bit in the UP of a MLC page is being read, the read level voltage signal having a second and a third read level voltage profile may be provided to the associated GAL of the GAL bus and the pass voltage signals having at least second and third pass voltage profiles may be provided to other GALs of the GAL bus.

The internal controller may configure, for concurrent memory access operations, block controllers, voltage regulator circuits, and GAL decoder circuits for the two or more memory planes based on respective page type (e.g., UP, MP, LP, SLC/MLC/TLC page). In some embodiments, each memory plane may be associated with individual read level voltage regulator and pass voltage regulator circuits and a respective individual GAL decoder circuit and a respective block controller. For the two or more memory planes, the internal controller may configure the individual read level voltage regulator and pass voltage regulator circuits, the respective GAL decoder circuit, and the respective block controller according to the particular memory access. For example, the internal controller may configure a first block controller, a first GAL decoder circuit, first read level voltage regulator circuit, and a first pass voltage regulator circuit for an UP read of a page within a block of a first memory plane. Further, the internal controller may contemporaneously configure a second block selector signal, a second GAL decoder circuit, a second read level voltage regulator, and a second pass voltage regulator circuit for a LP read of a different page within a different block of a second memory plane. The configured first and second GAL decoder circuits may concurrently provide the respective read level voltage signals to the respective pages of each of the two or more memory planes via the respective GAL buses. The concurrent memory access operations may include, for example, charging bitlines, and sensing and latching data at respective page buffers. In an example, the internal controller may control each of the read level voltage regulators to provide a read level voltage signal having a common prologue voltage profile and a common epilogue voltage profile that bookend an independent read level voltage profile selected based on a targeted page type during the read operation. In other examples, the internal controller may control the read level voltage regulators to provide respective read level voltage signals having a common voltage profile that includes read level voltages profiles associated with two or more memory page types (e.g., a first read level voltage signal associated with a first page type during a first time period, a second read level voltage signal associated with a second page type during a second time period, etc.), and may control the page buffer circuits latch data during a time period corresponding to a respective read level voltage signal having a voltage that corresponds to the targeted memory page type.

The common ramp through enabling all read level voltage signals may increase a read time operation, but may result in an internal controller that is less complex and physically smaller in size, as compared with the internal controller configured to control each voltage regulator individually. The internal controller configured to perform concurrent read accesses offer improved efficiency and performance of the memory 150 as compared with a memory with an internal controller that does not support concurrent access of multiple memory planes.

Figure 2:
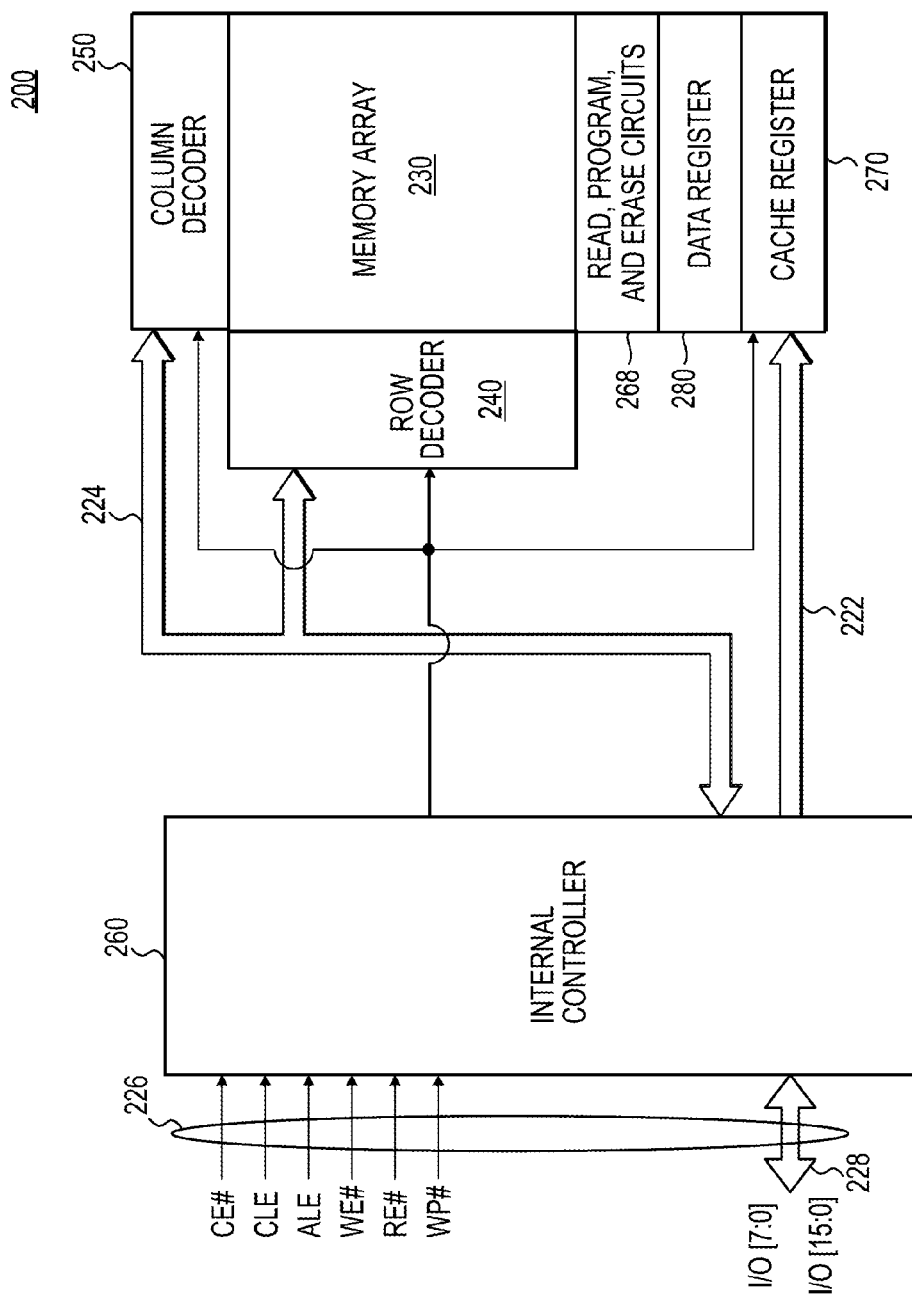
FIG. 2 is a block diagram of memory configured to perform concurrent memory access of multiple memory planes according to an embodiment of the present disclosure.

FIG. 2 illustrates a memory 200 configured to perform concurrent memory access of multiple memory planes according to an embodiment of the present disclosure. The memory 200 includes a memory array 230 with a plurality of memory cells. The memory cells may be non-volatile memory cells, such as NAND flash cells, or may generally be any type of memory cells. The memory 200 may be implemented in the memory 150 of FIG. 1. In some examples, the memory array 230 may be divided into a plurality of memory planes.

Command signals, address signals and data signals may be provided to the memory 200 as sets of sequential input/output ("I/O") signals transmitted through a command, address, and data (CAD) bus 226. Similarly, data signals may be provided from the memory 200 through the CAD bus 226. The CAD bus 226 may include an I/O bus 228 that is connected to an internal controller 260. The I/O bus 228 may provide the command signals, address signals, and data signals to the internal controller 260. The internal controller 260 may route the signals between the I/O bus 228 and an internal data bus 222, and an internal address bus 224. The internal controller 260 may be implemented in the memory 150 of FIG. 1. The internal controller 260 may receive a number of control signals through the CAD bus 226 to control the operation of the memory 200. The internal controller 260 may facilitate concurrent memory access of two or more memory planes of the memory array 230. In some examples, the internal controller 260 may be configured to concurrently access two or more memory planes, regardless of page type. For example, the internal controller 260 may receive the memory command and address pairs, and may provide (e.g., send) signals to the column decoder 250 and/or the row decoder 240 to configure read level voltage regulator and pass voltage regulator circuits (e.g., based on page type), GAL decoder circuits (e.g., based on page location), and block controllers (e.g., based on block selection) associated with the two or more memory planes of the memory array 230 based on the received memory command and address pairs. After configuring the voltage regulator circuits, the GAL decoder circuits, and the block controllers, the internal controller 260 may concurrently access the respective pages of each of the two or more memory planes of the memory array 230, for example, retrieving data or programming data, during the concurrent memory access operations, for example, by controlling, retrieving data from, and/or providing data to page buffers that are associated with each of the two or more memory planes. The concurrent memory access operations may include, for example, charging bitlines, and sensing and latching data at page buffers.

In some embodiments, the internal controller 260 may concurrently and independently control the read level voltage regulator and pass voltage regulator circuits of the column decoder 250 and/or the row decoder 240 for the concurrent memory access operations (e.g., the read level voltage profiles may operate completely independently from each other). In other embodiments, the internal controller 260 may concurrently control the read level voltage regulator and pass voltage regulator circuits of the column decoder 250 and/or the row decoder 240 to provide read level voltage signals having common voltage profiles for the concurrent memory access operations. For example, the concurrent memory access operation may include a common page type, and thus the read level voltage profiles may be common across the two or more planes. In another example, the internal controller 260 may control the read level voltage regulators to provide read level voltage signals having a common voltage profile that includes read level voltage profiles for two or more memory page types (e.g., a first read level voltage profile associated with a first page type during a first time period, a second read level voltage profile associated with a second page type during a second time period, etc.), and the page buffer circuits may latch a bit during a time period when the read level voltage signal has a value corresponding to the targeted page type. In another embodiment, the internal controller 260 may control each of the read level voltage regulators to provide read level voltage signals having a common prologue voltage profile and a common epilogue voltage profile that bookend an independent read level voltage profile selected based on a targeted page type during the read operation.

The address bus 224 provides block-row address signals to a row decoder 240 and column address signals to a column decoder 250. The row decoder 240 and column decoder 250 may be used to select blocks of memory or memory cells for memory operations, for example, read, program, and erase operations. The column decoder 250 may enable data signals to be provided to columns of memory corresponding to the column address signals and allow data signals to be provided from columns corresponding to the column address signals. In some examples, the column decoder 250 and/or the row decoder 240 may include a respective GAL decoder circuit and read level voltage regulator and pass voltage regulator circuits for each memory plane of the memory array 230. The GAL decoder circuits may be coupled to the respective memory planes via a respective plurality of global access lines.

In response to the memory commands decoded by the internal controller 260, the memory cells in the array 230 are read, programmed, or erased. Read, program, erase circuits 268 coupled to the memory array 230 receive control signals from the internal controller 260 and include voltage generators for providing various pumped voltages for read, program and erase operations.

After the row address signals have been provided to the address bus 224, the internal controller 260 provides (e.g., routes) data signals to a cache register 270 for a program operation. The data signals are stored in the cache register 270 in successive sets each having a size corresponding to the width of the I/O bus 228. The cache register 270 sequentially stores the sets of data signals for an entire page (e.g., row) of memory cells in the array 230. All of the stored data signals are then used to program a page of memory cells in the array 230 selected by the block-row address coupled through the address bus 224. In a similar manner, during a read operation, data signals from a page of memory cells selected by the block-row address coupled through the address bus 224 are stored in a data register 280. Sets of data signals corresponding in size to the width of the I/O bus 228 are then sequentially transferred through the internal controller 260 from the register 270 to the I/O bus 228.

Figure 3:
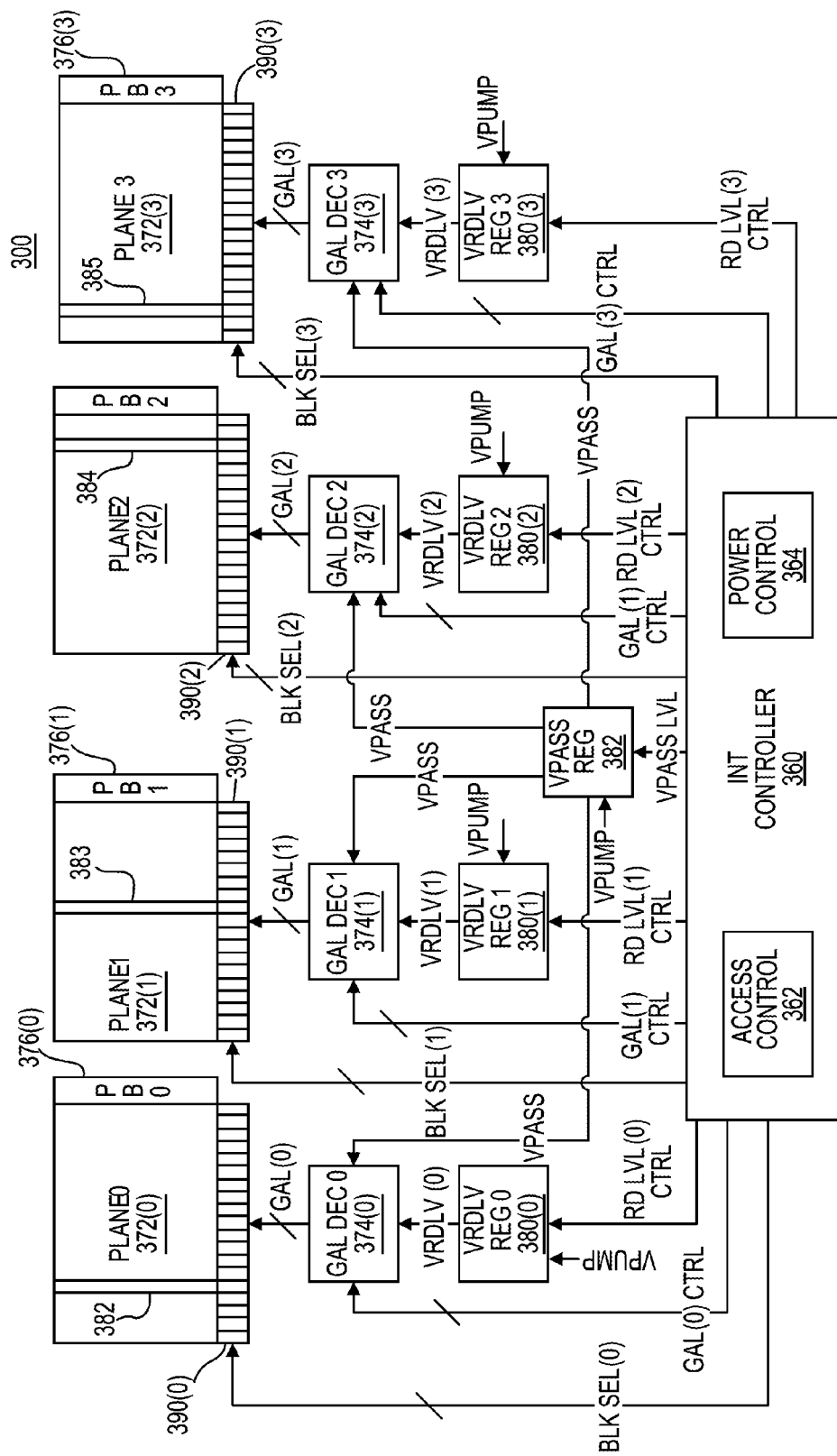
FIG. 3 is a block diagram of memory configured to perform concurrent memory access of multiple memory planes according to an embodiment of the present disclosure.

FIG. 3 illustrates a memory 300 configured to perform concurrent memory access of multiple memory planes according to an embodiment of the present disclosure. The memory 300 includes a memory array including a plurality of memory planes 372(0)-372(3). Each of the memory planes 372(0)-372(3) may include a respective plurality of memory cells. The memory 300 may further include an internal controller 360 including a power control circuit 364 and access control circuit 362 for concurrently performing memory access operations for multiple memory planes 372(0)-372(3). The memory 300 may be implemented in the memory 150 of FIG. 1 and/or the memory 200 of FIG. 2. The memory cells may be non-volatile memory cells, such as NAND flash cells, or may generally be any type of memory cells.

The memory planes 372(0)-372(3) may each be divided into blocks of data, with a different relative block of data from each of the memory planes 372(0)-372(3) concurrently accessible during memory access operations. For example, during memory access operations, data block 382 of the memory plane 372(0), data block 383 of the memory plane 372(1), data block 384 of the memory plane 372(2), and data block 385 of the memory plane 372(3) may each be accessed concurrently. Each of the memory planes 372(0)-372(3) may include a respective block controller 390(0-3) that is configured to couple the GAL(0-3) bus lines to a selected block responsive to the respective block select signals BLK SEL (0-3). The blocks 382, 383, 384, and 385 selected by the block controllers 390(0)-390(3) depicted in FIG. 3 are for illustrative purposes only. The memory plane 372(0)-372(3) may have any number of blocks, and a block controller 390(0-3) may have a corresponding number of block controllers.

Each of the memory planes 372(0)-372(3) may be coupled to a respective page buffer 376(0)-376(3). Each page buffer 376(0)-376(3) may be configured to provide data to or receive data from the respective memory plane 372 (0)-372(3). The page buffers 376(0)-376(3) may be controlled by the access control 362 of the internal controller 360. Data received from the respective memory plane 372(0)-372(3) may be latched at the page buffers 376(0)-376(3), respectively. In some instances, data may be latched by the respective page buffers 376(0)-376(3) and may be provided to the CAD bus, such as via the internal controller 360.

Each of the memory planes 372(0)-372(3) may be further coupled to a respective GAL decoder circuit 374(0)-374(3) via a respective GAL(0-3) bus. The GAL decoder circuits 374(0)-374(3) may be configured to provide respective read level voltage signals VRDLV(0-3) and respective pass voltage signals VPASS to a selected block of an associated memory plane 372(0)-372(3) via the respective GAL(0-3) bus during a memory access operation. Each of the GAL (0-3) buses may include individual GALs that are selectively coupled to a respective local access lines of a selected block of a plane during a memory access operation associated with a page of the selected block. The GAL decoder circuits 374(0)-374(3) may be controlled based on GAL(0-3) CTRL signals from the internal controller 360. Each of the GAL decoder circuits 374(0)-374(3) may be coupled to a read level voltage regulator circuit 380(0)-380(3) to receive a respective VRDLV(0-3) signal and to a pass voltage regulator circuit 382 to receive the respective VPASS signals. In some embodiments, all of the respective VPASS signals have common voltages and voltage profiles. In other embodiments, the respective VPASS signals may have different voltages and/or voltage profiles based on location relative to the GAL(0-3) receiving the respective VRDLV (0-3) signal. The GAL decoder circuits 374(0)-374(3) may provide the respective VRDLV(0-3) signal to one of the respective GAL(0-3) and one of the respective VPASS signals to each remaining GAL of the respective GAL(0-3) bus responsive to the GAL(0-3) CTLR signals.

The pass voltage regulator circuit 382 may be configured to provide the respective VPASS voltages based on a VPASS CTRL signal from the internal controller 360. The VPASS signals may have voltage profiles that are based on one or more page types being accessed during a memory access operation. The respective VPASS signals may be generated from a VPUMP voltage. The read level voltage regulator circuits 380(0)-380(3) may be configured to provide the respective VRDLV(0-3) signals based on a respective RD LVL(0-3) CTRL signal from the internal controller 360. The VRDLV(0-3) signals may have respective read level voltage profiles that are each based on a respective page type being accessed during a memory access operation. The VRDLV (0-3) signals may be generated from a VPUMP voltage.

The internal controller 360 may control the block controllers 390(0)-390(3), the GAL decoder circuits 374(0)-374 (3), the pass voltage regulator circuit 382, and the read level voltage regulator circuits 380(0)-380(3) to concurrently perform memory access operations associated with each of a group of memory command and address pairs (e.g., received from a controller, such as the 110 of FIG. 1). The internal controller 360 may include the power control circuit 364 that configures the pass voltage regulator circuit 382 and two or more of each of the GAL decoder circuits 374(0)-374(3) and the read level voltage regulator circuits 380(0)-380(3) for the concurrent memory access operations. The internal controller 360 may further include the access control circuit 362 configured to control two or more of the page buffers 376(0)-376(3) to sense and latch data from the respective memory planes 372(0)-372(3), or program data to the respective memory planes 372(0)-372(3) during the concurrent memory access operations.

In operation, the internal controller 360 may receive a group of memory command and address pairs via the CAD bus, with each pair arriving in parallel or serially. In some examples, the group of memory command and address pairs may be associated with two or more memory planes 372 (0)-372(3). The internal controller 360 may be configured to perform concurrent memory access operations (e.g., read operations or program operations) for the two or more memory planes 372(0)-372(3) responsive to the group of memory command and address pairs. The internal controller 360 may be configured to control memory circuits to concurrently access multiple memory planes. For example, the power control circuit 364 of the internal controller 360 may configure the read level voltage regulator circuits 380(0)-380(3), the pass voltage regulator circuit 382, the GAL decoder circuits 374(0)-374(3), and the block controllers 390(0)-390(3) associated with the two or more memory planes 372(0)-372(3) for the concurrent memory access operations. The configuration of the block controllers 390 (0)-390(3) may include providing the respective BLK SEL (0-3) signals to the respective block controllers 390(0)-390 (3) to cause a respective GAL(0-3) bus to be coupled to local access lines of a selected block. The configuration of the GAL decoder circuits 374(0)-374(3) to provide GAL(0-3) CTRL signals having values based on a location of a respective page to be accessed within a block. The configuration of the read level voltage regulator circuits 380(0)-380 (3) and the pass voltage regulator circuit 382 may include providing the RD LVL(0-3) CTRL signals and the VPASS CTRL signal having respective values based on a respective page type (e.g., UP, MP, LP, SLC/MLC/TLC page). In some embodiments with a single pass voltage regulator circuit 382, page type combinations may be limited to page types capable of being accessed using a single VPASS signal. In other embodiments with multiple pass voltage regulator circuits 382, page type combinations may be open to page types capable of being accessed using a different VPASS signals. After the block controllers 390(0)-390(3), the read level voltage regulator circuits 380(0)-380(3), the pass voltage regulator circuit 382, and the GAL decoder circuits 374(0)-374(3) have been configured, the access control 362 may cause the page buffers 376(0)-376(3) to access the respective pages of each of the two or more memory planes 372(0)-372(3), which may include retrieving data or writing data during the concurrent memory access operations. For example, the access control circuit 362 may concurrently (e.g., in parallel and/or contemporaneously) control the page buffers 376(0)-376(3) to charge/discharge bitlines, sense data from the two or more memory planes 372(0)-372(3), and/or latch the data.

Based on the signals received from the internal controller 360, the GAL decoder circuits 374(0)-374(3) that are coupled to the two or more memory planes 372(0)-372(3) may provide one of the respective VRDLV(0-3) signal or the respective VPASS signal to each individual GAL of the respective GAL(0-3) buses. Further, one of the GAL decoder circuits 374(0)-374(3) may provide a respective VRDLV(0-3) signal to a different respective GAL of the respective GAL(0-3) bus than the respective GAL of the GAL(0-3) bus that is provided the respective VRDLV(0-3) signal by another of the of the GAL decoder circuits 374(0)-374(3). As an example, the GAL decoder circuit 374(0) may provide the VRDLV(0) signal to a first GAL of the GAL(0) bus and may provide a respective VPASS signal to remaining GALs of the GAL(0) bus. The GAL decoder circuit 374(1) may provide the VRDLV(1) signal to a third GAL of the GAL(1) bus and may provide a respective VPASS signal to remaining GALs of the GAL(1) bus. The GAL decoder circuit 374(2) may provide the VRDLV(2)

signal to a seventh GAL of the GAL(2) bus and may provide a respective VPASS signal to remaining GALs of the GAL(2) bus, etc. The internal controller 360, the block controllers 390(0)-390(3), the GAL decoder circuits 374(0)-374(3), the read level voltage regulator circuits 380(0)-380(3), and the pass voltage regulator circuit 382 may allow different respective pages within a different selected block of two or more memory planes 372(0)-372(3) to be accessed concurrently. For example, a first page of a first block of a first memory plane 372(0) may be accessed concurrently with a second page of a second block of a second memory plane 372(1), regardless of page type.

Figure 7:
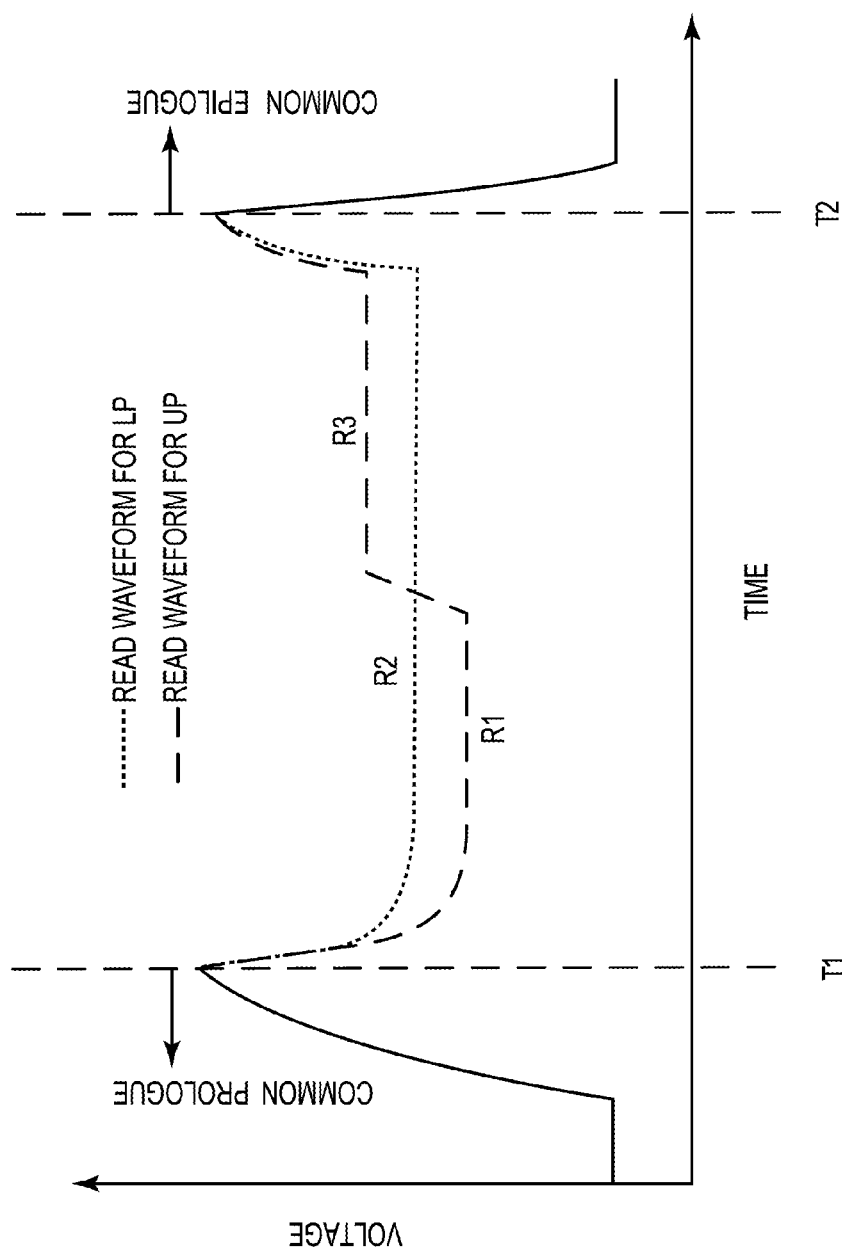
FIG. 7 is an illustration of an exemplary voltage profile of a read level voltage according to an embodiment of the present disclosure.

In some embodiments, the power control 364 may control the VRDLV(0-3) signals provided by the read level voltage regulator circuits 380(0)-380(3) independently. For example, the power control 364 may provide each of the read level control signals RD LVL (0-3) CTRL concurrently and independently such that a different respective VRDLV (0-3) is provided by each of the read level voltage regulator circuits 380(0)-380(3). In another embodiment, the power control 364 of the internal controller 360 may control the VRDLV(0-3) signals provided by the read level voltage regulator circuits 380(0)-380(3) to have a common prologue voltage profile and a common epilogue voltage profile that bookend an independent read level voltage profile selected based on a targeted page type during the memory access operation. For example, FIG. 7 depicts a read voltage profile with a common prologue voltage profile prior to time T1, a common epilogue voltage profile after time T2, and an independent read level voltage profile that is selected based on a page type between times T1 and T2.

Figure 6:
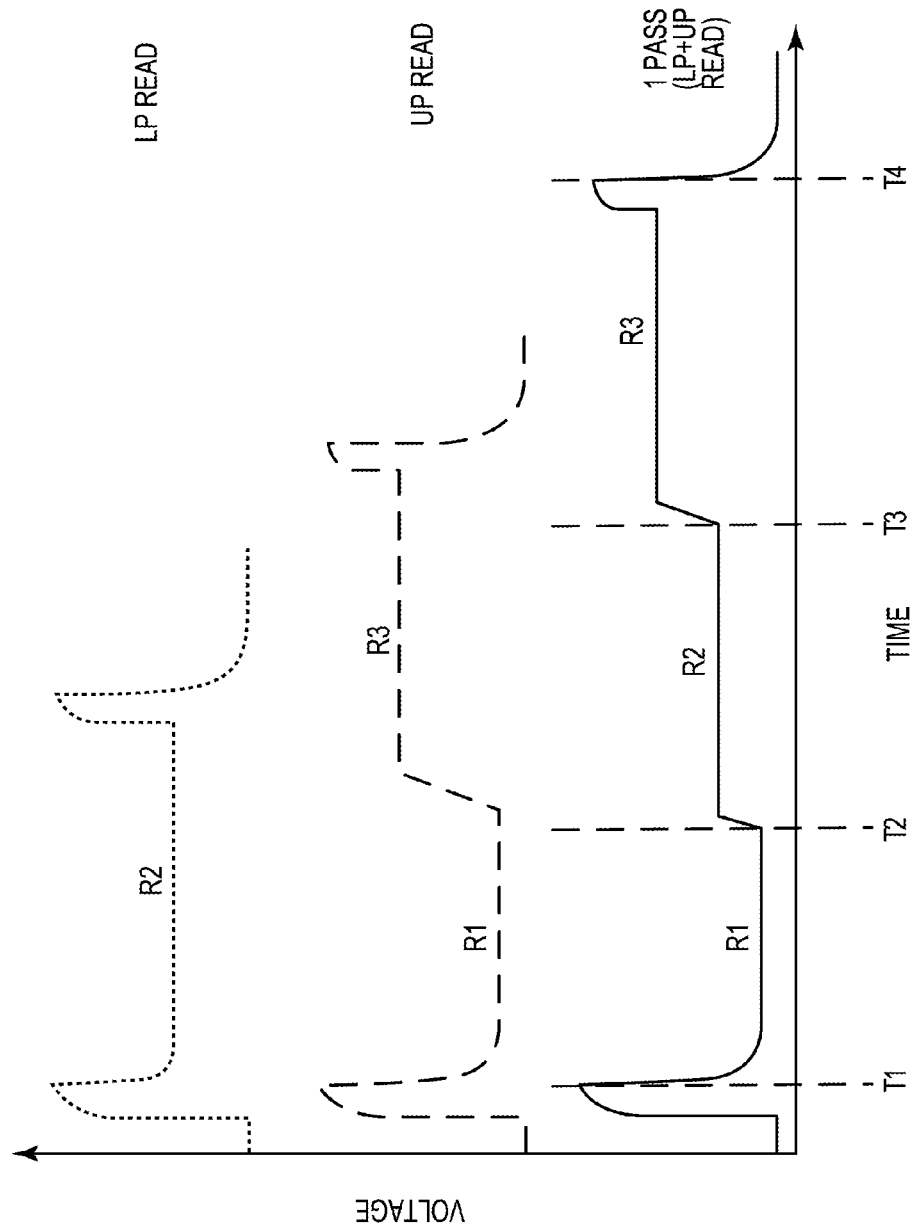
FIG. 6 is an illustration of an exemplary voltage profile of a read level voltage according to an embodiment of the present disclosure.

In yet another embodiment, the power control 364 may control the VRDLV(0-3) signals provided by the read level voltage regulator circuits 380(0)-380(3) to have a common voltage profile that passes through read level voltages for more than one page type during the memory access operation. For example, the bottom voltage profile of FIG. 6 depicts a 1-pass read level voltage profile that includes a LP read level voltage profile (top voltage profile) and an UP read level voltage profile (middle voltage profile). The LP read may be performed between times T2 and T3, and the UP read may be performed between times T3 and T4, as well as T1 and T2. The access control 362 may control the page buffers 376(0)-376(3) to latch data at the appropriate time based on the page type. The 1-pass voltage profile for multiple page types may result in a longer memory access operation, but may simplify the internal controller 360 as compared with an internal controller capable of providing completely independent voltage profiles. Further, similar to the single pass voltage regulator circuit 382, implementing a 1-pass voltage profile that encompasses multiple page types may allow the read level voltage regulator circuits 380(0)-380(3) to be combined into a single read level voltage regulator circuit, as a common read level voltage profile is being provided to each of the two or more memory planes.

The page buffers 376(0)-376(3) may provide data to or receive data from the internal controller 360 during the memory access operations responsive to signals from the internal controller 360 and the respective memory planes 372(0)-372(3). The internal controller 360 may provide the received data to a controller, such as the controller 110 of FIG. 1.

It will be appreciated that the memory 300 may include more or less than four memory planes, GAL decoder circuits, read level voltage regulator circuits, and page buffers. It will also be appreciated that each of the GAL(0-3) buses may include 8, 16, 32, 64, 128, etc., individual global access lines. The internal controller 360, the GAL decoder circuits 374(0)-374(3), and the read level voltage regulator circuits 380(0)-380(3) may concurrently access different respective pages within different respective blocks of multiple memory planes when the different respective pages are of a different page type.

Figure 4:
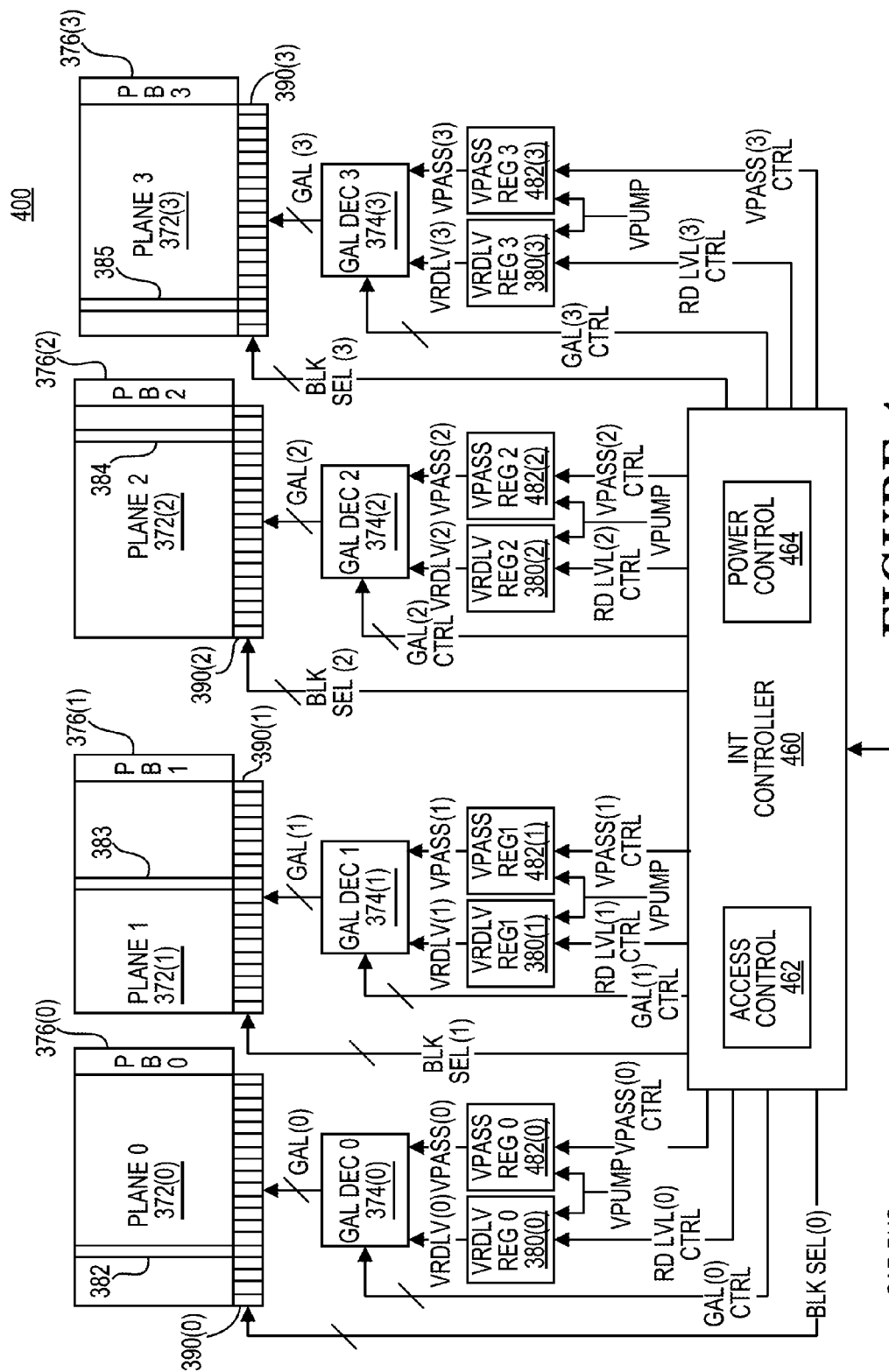
FIG. 4 is a block diagram of memory configured to perform concurrent memory access of multiple memory planes according to an embodiment of the present disclosure.

FIG. 4 illustrates a memory 400 configured to perform concurrent memory access of multiple memory planes according to an embodiment of the present disclosure. The memory 400 includes a memory array including a plurality of memory planes 372(0)-372(3). Each of the memory planes 372(0)-372(3) may include a respective plurality of memory cells. The memory 300 may further include an internal controller 460 including a power control circuit 464 and access control circuit 462 for concurrently performing memory access operations for multiple memory planes 372(0)-372(3). The memory 400 may be implemented in the memory 150 of FIG. 1, and/or the memory 200 of FIG. 2. The memory 400 may include elements that have been previously described with respect to the memory 300 of FIG. 3. Those elements have been identified in FIG. 4 using the same reference numbers used in FIG. 3 and operation of the common elements is as previously described. Consequently, a detailed description of the operation of these particular elements will not be repeated in the interest of brevity.

Each of the GAL decoder circuits 374(0)-374(3) may be coupled to a read level voltage regulator circuit 380(0)-380(3) to receive a respective VRDLV(0-3) signal and to a respective pass voltage regulator circuit 482(0)-482(3) to receive respective pass voltage signals VPASS(0-3). The GAL decoder circuits 374(0)-374(3) may provide one of the respective VRDLV(0-3) voltage or the respective VPASS (0-3) signal to each individual GAL of the respective GAL (0-3) bus responsive to the GAL(0-3) CTLR signals.

The pass voltage regulator circuits 482(0)-482(3) may be configured to provide the respective VPASS(0-3) signals based on a respective VPASS(0-3) CTRL signal from the internal controller 460. The VPASS(0-3) signals may have respective voltage profiles that are each based on a respective page type being accessed during a memory access operation and/or based on a location of a particular GAL within the block of GAL(0-3). The VPASS(0-3) signals may be generated from a VPUMP voltage.

The internal controller 460 may control the block controllers 390(0)-390(3), the GAL decoder circuits 374(0)-374(3), the pass voltage regulator circuits 482(0)-482(3), and the read level voltage regulator circuits 380(0)-380(3) to concurrently perform memory access operations associated with each of a group of memory command and address pairs (e.g., received from a controller, such as the 110 of FIG. 1). The internal controller 460 may include the power control circuit 464 that configures two or more of each of the block controllers 390(0)-390(3), the GAL decoder circuits 374(0)-374(3), the pass voltage regulator circuits 482(0)-482(3), and the read level voltage regulator circuits 380(0)-380(3) for the concurrent memory access operations. The internal controller 460 may further include the access control circuit 462 configured to control two or more of the page buffers 376(0)-376(3) to sense and latch data from the respective memory planes 372(0)-372(3), or program data to the respective memory planes 372(0)-372(3) to perform the concurrent memory access operations.

In operation, the internal controller 460 may receive a group of memory command and address pairs via the CAD bus. In some examples, the group of memory command and address pairs may each be associated with a different respective memory plane 372(0)-372(3). The internal controller 460 may be configured to perform concurrent memory access operations (e.g., read operations or program operations) for the multiple memory planes 372(0)-372(3) responsive to the group of memory command and address pairs. In some examples, the group of memory command and address pairs may be associated with two or more memory planes 372(0)-372(3). The internal controller 460 may be configured to perform concurrent memory access operations (e.g., read operations or program operations) for the two or more memory planes 372(0)-372(3) responsive to the group of memory command and address pairs. The internal controller 360 may be configured to control memory circuits to concurrently access multiple memory planes. For example, the power control circuit 464 of the internal controller 460 may configure the read level voltage regulator circuits 380(0)-380(3), the pass voltage regulator circuits 482(0)-482(3), the GAL decoder circuits 374(0)-374(3), and the block controllers 390(0)-390(3) associated with the two or more memory planes 372(0)-372(3) for the concurrent memory access operations. The configuration of the block controllers 390(0)-390(3) may include providing the respective BLK SEL(0-3) signals to the respective block controllers 390(0)-390(3) to cause a respective GAL(0-3) bus to be coupled to local access lines of a selected block. The configuration of the GAL decoder circuits 374(0)-374(3) may include provisions of GAL(0-3) CTRL signals having values based on a location of a respective page to be accessed within a block. The configuration of the read level voltage regulator circuits 380(0)-380(3) and the pass voltage regulator circuits 482(0)-482(3) may include providing the RD LVL(0-3) CTRL signals and the VPASS CTRL(0-3) signals having respective values based on a respective page type (e.g., UP, MP, LP, SLC/MLC/TLC page). Independently controlling the pass voltage regulator circuits 482(0)-482(3) may allow any page type combination to be concurrently accessed. After the block controllers 390(0)-390(3), the read level voltage regulator circuits 380(0)-380(3), the pass voltage regulator circuits 482(0)-482(3), and the GAL decoder circuits 374(0)-374(3) have been configured, the access control 362 may cause the page buffers 376(0)-376(3) to access the respective pages of each of the two or more memory planes 372(0)-372(3), which may include retrieving data or writing data, during the concurrent memory access operations. For example, the access control circuit 362 may concurrently (e.g., in parallel and/or contemporaneously) control the page buffers 376(0)-376(3) to charge/discharge bitlines, sense data from the two or more memory planes 372(0)-372(3), and/or latch the data.

Based on the signals received from the internal controller 460, the GAL decoder circuits 374(0)-374(3) that are coupled to the two or more memory planes 372(0)-372(3) may provide one of the respective VRDLV(0-3) signal or the respective VPASS(0-3) signal to each individual GAL of the respective GAL(0-3) buses. Further, one of the GAL decoder circuits 374(0)-374(3) may provide a respective VRDLV(0-3) signal to a different respective GAL of the respective GAL(0-3) bus than the respective GAL of the GAL(0-3) bus that is provided the respective VRDLV(0-3) signal by another of the of the GAL decoder circuits 374(0)-374(3). As an example, the GAL decoder circuit 374(0) may provide the VRDLV(0) signal to a first GAL of the GAL(0) bus and may provide the respective VPASS(0) signal to remaining GALs of the GAL(0) bus. In some examples, the VPASS(0) signal may represent more than on VPASS voltage profile or voltage signal. The GAL decoder circuit 374(1) may provide the VRDLV(1) signal to a third GAL of the GAL(1) bus and may provide the respective VPASS(1) signal to remaining GALs of the GAL(1) bus. In some examples, the VPASS(1) signal may represent more than on VPASS voltage profile or voltage signal. The GAL decoder circuit 374(2) may provide the VRDLV(2) signal to a seventh GAL of the GAL(2) bus and may provide the respective VPASS(2) signal to remaining GALs of the GAL(2) bus, etc. In some examples, the VPASS(2) signal may represent more than on VPASS voltage profile or voltage signal. The internal controller 460, the block controllers 390(0)-390(3), the GAL decoder circuits 374(0)-374(3), the read level voltage regulator circuits 380(0)-380(3), and the pass voltage regulator circuits 482(0)-482(3) may allow different respective pages within a different selected block of two or more memory planes 372(0)-372(3) to be accessed concurrently.

In some embodiments, the power control 464 of the internal controller 460 may control the VRDLV(0-3) signals provided by the read level voltage regulator circuits 380(0)-380(3) independently, and may also control the VPASS(0-3) signals provided by the pass voltage regulator circuits 382(0)-382(3) independently. In another embodiment, the power control 464 may control the VRDLV(0-3) signals provided by the read level voltage regulator circuits 380(0)-380(3) to have a common prologue voltage profile and a common epilogue voltage profile that bookend an independent read level voltage profile selected based on a targeted page type during the memory access operation. In yet another embodiment, the power control 464 may control the VRDLV(0-3) signals provided by the read level voltage regulator circuits 380(0)-380(3) to have a common voltage profile that passes through read level voltages for more than one page type during the memory access operation.

The page buffers 376(0)-376(3) may provide data to or receive data from the internal controller 460 during the memory access operations responsive to signals from the internal controller 460 and the respective memory planes 372(0)-372(3). The internal controller 460 may provide the received data to a controller, such as the controller 110 of FIG. 1.

It will be appreciated that the memory 400 may include more or less than four memory planes, GAL decoder circuits, read level voltage regulator circuits, pass voltage regulator circuits, and page buffers. It will also be appreciated that each of the GAL(0-3) buses may include 8, 16, 32, 64, 128, etc., individual global access lines. The internal controller 460, the GAL decoder circuits 374(0)-374(3), and the read level voltage regulator circuits 380(0)-380(3) may concurrently access different respective pages within different respective blocks of multiple memory planes when the different respective pages are of a different page type.

Figure 5:
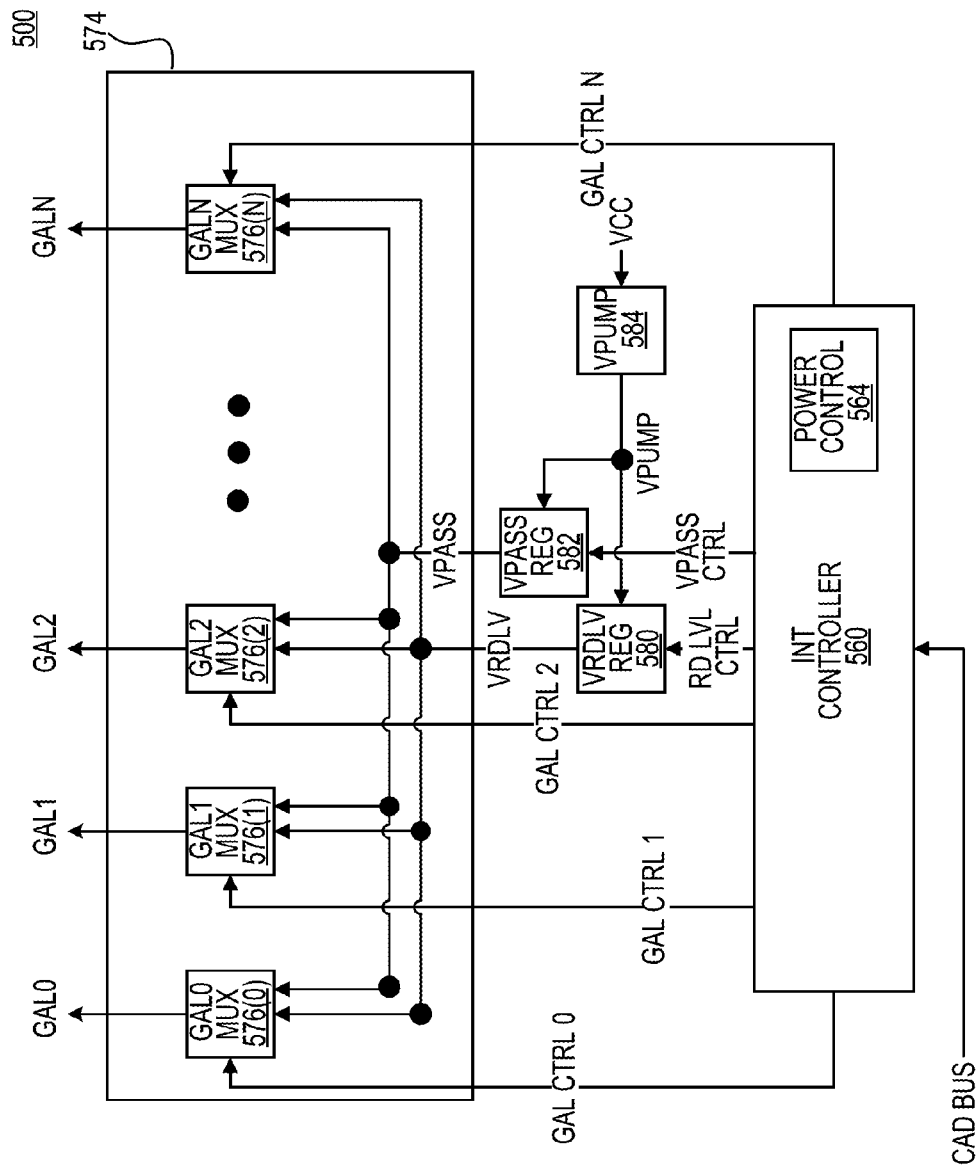
FIG. 5 is a block diagram of a portion of a memory configured to perform concurrent memory access of multiple memory planes according to an embodiment of the present disclosure.

FIG. 5 illustrates a portion of a memory 500 configured to perform concurrent memory access of multiple memory planes according to an embodiment of the present disclosure. The portion of the memory 500 includes a GAL decoder circuit 574 having GAL0-N multiplexer circuits 576(0)-576(N). The portion of the memory 500 may further include an internal controller 560 including a power control circuit 564 configured to control the GAL decoder circuit 574. The portion of the memory 500 may further include a read level voltage regulator 580, a pass voltage regulator 582, and a voltage pump 584. The portion of the memory 500 may be implemented in the memory 150 of FIG. 1 and/or the memory 200 of FIG. 2. The GAL decoder circuit 574 may be implemented in any of the GAL decoder circuits 374(0)-374(3) of FIGS. 3 and/or 4, and the internal controller 560 may be implemented in the internal controller 260 of FIG. 2, the internal controller 360 of FIG. 3, and/or the internal controller 460 of FIG. 4.

During a memory access operation, each of GAL0-N multiplexer circuits 576(0)-576(N) may be configured to provide a VRDLV signal to one of respective GAL0-N lines and respective VPASS signals to respective remaining GAL0-N lines responsive to a respective GAL CTRL 0-N signal from the internal controller 560. The GAL0-N lines may correspond to a set of lines of any one of the GAL(0-3) buses of FIG. 3 or 4. In some examples, the VRDLV signal may be provided on one of the GAL0-N lines, and the VPASS signal may be provided to the remaining GAL0-N lines during the memory access operation.

The voltage pump 584 may provide a pumped voltage VPUMP to the read level voltage regulator 580 and the pass voltage regulator 582. The read level voltage regulator 580 and the pass voltage regulator 582 may provide the VRDLV signal and the respective VPASS signals, respectively, from the VPUMP voltage. The read level voltage regulator 580 may provide the VRDLV signal responsive to the RD LVL CTRL signal from the internal controller 560. The VRDLV signal may have a profile that is based on a page type being accessed during the memory access operation. The pass voltage regulator 582 may provide the respective VPASS signals responsive to the VPASS CTRL signal from the internal controller 560. The VPASS signals may have a value that is based on a page type being accessed during the memory access operation and/or based on a location other GALs relative to the GAL to be accessed via the VRDLV signal.

While FIG. 5 only depicts a single GAL decoder circuit 574, a single read level voltage regulator 580, and a single pass voltage regulator 582, the portion of the memory 500 may include two or more of some or each and the internal controller 560 may concurrently configure the two or more GAL decoder circuits, the two or more VRDLV signal regulator circuits, and the two or more VPASS signal regulator circuits during a memory access operation. Control of the GAL decoder circuit 574 by the internal controller 560 may include controlling each of the GAL0-N multiplexer circuits 576(0)-576(N). The internal controller 560 may include the power control circuit 564 that configures the read level voltage regulator 580, the pass voltage regulator 582, and the GAL0-N multiplexer circuits 576(0)-576(N) of the GAL decoder circuit 574 to provide one of a VRDLV or VPASS signals to the GAL0-N lines during the memory access operation.

In operation, the internal controller 560 may receive a group of memory command and address pairs via the CAD bus. In some examples, the group of memory command and address pairs may each be associated with a different respective memory plane (not shown). The internal controller 560 may be configured to perform concurrent memory access operations (e.g., read operations or program operations) for the multiple memory planes responsive to the group of memory command and address pairs.

In performing the memory access operation on one of the memory planes, the power control circuit 564 of the internal controller 560 may configure the read level voltage regulator 580, the pass voltage regulator 582, and each of the GAL0-N multiplexer circuits 576(0)-576(N) of the GAL decoder circuit 574 to provide one of the VRDLV signal or the respective VPASS signals to the GAL0-N lines when the one of the memory planes is associated with one of the group of memory command and address pairs for the concurrent memory access operation. The configuration of the read level voltage regulator 580 and the pass voltage regulator 582 may be based on respective page type (e.g., UP, MP, LP, SLC/MLC/TLC page), as the VRDLV and VPASS signals required to access a page may be based on a page type. After the read level voltage regulator 580, the pass voltage regulator 582, and the GAL decoder circuit 574 have been configured to provide one of the VRDLV or VPASS signals on each of the GAL0-N lines, the internal controller 560 may access a respective memory page coupled to the GALP0-N lines.

In some embodiments, the power control 564 may control the VRDLV signals provided by the read level voltage regulator circuit 580 may have a voltage profile that passes through read level voltages for more than one page type during the memory access operation. In another embodiment, the power control 564 may control the VRDLV signal provided by the read level voltage regulator circuits 580 to have a prologue voltage profile and an epilogue voltage profile that bookend an independent read level voltage profile selected based on a targeted page type during the memory access operation.

It will be appreciated that the portion of the memory 500 may include more than one GAL decoder circuit, read level voltage regulator circuits, and pass voltage regulator circuits. It will also be appreciated that each of the GAL0-N may include 8, 16, 32, 64, 128, etc., global access lines.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:
1. An apparatus, comprising:
a memory array comprising a plurality of memory planes, wherein each of the plurality of memory planes comprises a plurality of memory cells;
a plurality of global access line decoder circuits, wherein a global access line decoder circuit of the plurality of global access line decoder circuits is coupled to a respective one of the plurality of memory planes via a respective global access line bus, wherein, during a memory access operation, the global access line decoder circuit is configured to provide a read level voltage signal to one of a plurality of global access lines of the respective global access line bus and to provide a respective pass voltage signal on each remaining global access line of the plurality of global access lines of the respective global access line bus;
a plurality of read level voltage regulator circuits, wherein a read level voltage regulator circuit of the plurality of read level voltage regulator circuits is coupled to the global access line decoder circuit and configured to provide the read level voltage signal;
a pass voltage regulator circuit coupled to the global access line decoder circuit and configured to provide the respective pass voltage signals; and
a controller configured to perform concurrent memory access operations on two or more of the plurality of memory planes, wherein, during the concurrent memory access operations, the controller is configured to control two or more of the plurality of read level voltage regulator circuits to provide respective read level voltages each having a voltage profile associated with a respective page type, wherein, during the memory access operation, the controller is further configured to control the pass voltage regulator circuit to provide the respective pass voltage signals having respective voltage profiles associated with a page type.

2. The apparatus of claim 1, wherein a second global access line decoder circuit of the plurality of global access line decoder circuits is coupled to another respective one of the plurality of memory planes via a second respective global access line bus, wherein, during the concurrent memory access operations, the second global access line decoder circuit is configured to provide a second read level voltage signal on one of a plurality of global access lines of the second respective global access line bus and to provide the respective pass voltage signals on each remaining global access line of the plurality of global access lines of the second respective global access line bus.

3. The apparatus of claim 2, wherein the second read level voltage signal has a different voltage profile than the read level voltage signal.

4. The apparatus of claim 2, wherein the read level voltage signal and the second read level voltage signal have a common epilogue portion and a common prologue portion.

5. The apparatus of claim 2, wherein the read level voltage signal and the second read level voltage signal have a common voltage profile.

6. The apparatus of claim 5, wherein the common voltage profile includes read level voltages associated with more than one page type.

7. The apparatus of claim 1, wherein the controller comprises a power control circuit configured to, during the memory access operation, control the global access line decoder circuit to provide the read level voltage signal to a particular one of the plurality of global access lines of the respective global access line bus and to provide the respective pass voltage signals to each remaining global access line of the plurality of global access lines.

8. The apparatus of claim 1, further comprising a plurality of block controllers, wherein, during the concurrent memory access operations, a block controller of the plurality of block controllers is configured to couple the global access line bus to local access lines of a block of the memory plane selected based on a block selection signal from the controller.

9. The apparatus of claim 8, further comprising a plurality of page buffers, wherein, during the concurrent memory access operations, a page buffer of the plurality of page buffers is configured to latch data from a page of the selected block of the memory plane.

10. The apparatus of claim 1, wherein the concurrent memory access operations include two or more page types.

11. An apparatus, comprising:
a memory array comprising a plurality of memory planes, wherein each of the plurality of memory planes comprises a plurality of memory cells;
a plurality of global access line decoder circuits, wherein a global access line decoder circuit of the plurality of global access line decoder circuits is coupled to a respective one of the plurality of memory planes via a respective global access line bus, wherein, during a memory access operation, the global access line decoder circuit is configured to provide a read level voltage signal on one of a plurality of global access lines of the respective global access line bus and to provide a respective pass voltage signal on each remaining global access line of the plurality of global access lines;
a plurality of read level voltage regulator circuits, wherein a read level voltage regulator circuit of the plurality of read level voltage regulator circuits is coupled to the global access line decoder circuit and configured to provide the read level voltage signal;
a plurality of pass voltage regulator circuits, wherein a pass voltage regulator circuit of the plurality of pass voltage regulator circuits is coupled to the global access line decoder circuit and configured to provide the respective pass voltage signals; and
a controller configured to concurrently perform memory access operations on two or more of the plurality of memory planes, wherein, during the concurrent memory access operations, the controller is configured to control two or more of the plurality of read level voltage regulator circuits to provide respective read level voltage signals each having a respective voltage profile associated with a respective page type, wherein, during the memory access operation, the controller is further configured to control two or more of the plurality of pass voltage regulator circuits to provide respective pass voltage signals each having a respective voltage profile associated with the respective page type.

12. The apparatus of claim 11, wherein the global access line decoder circuit comprises a plurality of global access line multiplexer circuits each configured to receive the read level voltage signal and the respective pass voltage signals and to provide one of the read level voltage signal or the respective pass voltage signals to a coupled global access line of the plurality of global access lines responsive to a signal from the controller.

13. The apparatus of claim 11, wherein a second read level voltage regulator circuit of the plurality of read level voltage regulator circuits is coupled to a second global access line decoder circuit of the plurality of global access line decoder circuits and configured to provide a second read level voltage signal, wherein the second read level voltage signal is provided based on a different page type than the read level voltage signal provided by the read level voltage regulator circuit.

14. The apparatus of claim 12, wherein, during the concurrent memory access operations, a first portion of a voltage profile of the second read level voltage signal is the same as a first portion of a voltage profile of the read level voltage signal.

15. The apparatus of claim 12, wherein, during the concurrent memory access operations, a last portion of a voltage profile of the second read level voltage signal is the same as a last portion of a voltage profile of the read level voltage signal.

16. The apparatus of claim 12, wherein, during the concurrent memory access operations, a middle portion of a voltage profile of the second read level voltage signal is the same as a middle portion of a voltage profile of the read level voltage signal.

17. The apparatus of claim 11, further comprising:
a plurality of block controllers, wherein, during the concurrent memory access operations, a block controller of the plurality of block controllers is configured to couple the global access line bus to local access lines of a selected block of the memory plane; and
a plurality of page buffers, wherein, during the concurrent memory access operations, a page buffer of the plurality of page buffers is configured to latch data from a respective one of the plurality of memory planes.

18. An apparatus, comprising:
a first memory plane coupled to a first global access line bus;
a second memory plane coupled to a second global access line bus;

a first global access line decoder circuit comprising a first plurality of global access line multiplexer circuits, wherein one of the first plurality of global access line multiplexer circuits is configured to provide a first read level voltage signal to a respective global access line of the first global access line bus and remaining global access line multiplexer circuits of the first plurality of global access line multiplexer circuits are configured to provide a respective pass voltage signal to remaining global access lines of the first plurality of global access lines of the first global access line bus;

a second global access line decoder circuit comprising a second plurality of global access line multiplexer circuits, wherein one of the second plurality of global access line multiplexer circuits is configured to provide a second read level voltage signal to a respective global access line of the second global access line bus and remaining global access line multiplexer circuits of the second plurality of global access line multiplexer circuits are configured to provide a respective pass voltage signal to remaining global access lines of the second plurality of global access lines of the second global access line bus;

a first read level voltage regulator circuit configured to provide the first read level voltage signal having a voltage profile based on a first page type of a page of the first memory plane accessed during a memory access operation; and a second read level voltage regulator circuit configured to provide the second read level voltage signal having a voltage profile based on a second page type of a page of the second memory plane accessed concurrently with the page of the first memory plane during the memory access operation.

19. The apparatus of claim 18, further comprising a pass voltage regulator circuit configured to provide the respective pass voltage signals.

20. The apparatus of claim 18, wherein the pass voltage regulator is a first pass voltage regulator and the pass signal is a first pass voltage signal provided to the first global access line decoder, the apparatus further comprising a second pass voltage regulator circuit configured to provide a second pass voltage signal to the second global access line decoder, wherein a voltage of the first pass voltage signal is different than a voltage of the second pass voltage signal.

21. The apparatus of claim 18, wherein at least a portion of the voltage profile of the second read level voltage signal is different than the voltage profile of the read level voltage signal.

22. The apparatus of claim 18, wherein the first page type is an upper page and the second page type is a lower page.

23. The apparatus of claim 18, further comprising a controller configured to provide first control signals to the first global access line decoder circuit having values based on a page of the first memory plane to be accessed during the memory access operation and to provide second control signals to the second global access line decoder circuit having values based on a page of the second memory plane to be accessed during the memory access operation.

24. A method, comprising:
receiving a first memory access command and address pair associated with a first memory plane of a memory and a second memory access command and address pair associated with a second memory plane of the memory;
responsive to receiving the first memory command and address pair:

providing a first read level voltage from a first read level voltage regulator circuit having a voltage profile based on a first page type, wherein the first page type is determined from the first memory command and address pair; and configuring a first global access line decoder circuit to provide the first read level voltage signal on one of a first plurality of global access lines of a first global access line bus coupled to the first memory plane and a respective pass voltage signal on each remaining global access line of the first plurality of global access lines; and concurrently with configuring the first global access line decoder circuit and responsive to receiving the second memory command and address pair:

providing a second read level voltage from a second read level voltage regulator circuit having a voltage profile based on a second page type, wherein the second page type is determined from the second memory command and address pair; and configuring a second global access line decoder circuit to provide the second read level voltage signal on one of a second plurality of global access lines of a second global access line bus coupled to the second memory plane and the respective pass voltage signals on each remaining global access line of the second plurality of global access lines.

25. The method of claim 24, further comprising:
coupling the first global access line bus to local access lines of a first selected block of the first memory plane; and
coupling the second global access line bus to local access lines of a selected block of the second memory plane.

26. The method of claim 24, further comprising providing a common prologue on the first read level voltage and the second read level voltage during the memory access operation.

27. The method of claim 26, further comprising providing a common epilogue on the first read level voltage and the second read level voltage during the memory access operation.

28. The method of claim 24, further comprising concurrently latching first data from the first memory plane based on the first read level voltage signal and latching second data from the second memory plane based on the second read level voltage signal.

29. The method of claim 24, further comprising providing the latched first data and second data at an output of the memory.

30. A method, comprising:
receiving a plurality of memory command and address pairs at a memory, wherein the plurality of memory command and address pairs are associated with two or more memory planes of the memory and are associated with two or more page types; and
responsive to receiving the plurality of memory command and address pairs: providing a read level voltage signal that includes a voltage profile covering voltage levels of each of the two or more page types; and
concurrently accessing different respective pages of the two or more memory planes based on the read level voltage signal, wherein the different respective page accessed at each of the two or more memory planes is determined from the memory command and address pairs.

31. The method of claim 30, wherein concurrently accessing different respective pages of the two or more memory planes based on the read level voltage signal comprises latching respective data from the different respective pages of the two or more memory planes responsive to a voltage of the read level voltage signal corresponding to a page type of a target page.

32. The method of claim 30, further comprising providing the read level voltage signal to one of a plurality of global access lines of a global access line bus coupled to one of the two or more memory planes.

33. The method of claim 32, further comprising providing the read level voltage signal to one of a second plurality of global access lines of a second global access line bus coupled to another of the two or more memory planes, wherein a position of the one of the second plurality of global access lines of the second global access line bus to which the read level voltage signal is provided is different than a relative position of the one of the plurality of global access lines of the global access line bus to which the read level voltage signal is provided.

34. The method of claim 30, further comprising providing a pass voltage signal to remaining global access lines of the plurality of global access lines of the global access line bus.

* * * * *